(12) United States Patent
Cann et al.

(10) Patent No.: US 10,056,539 B2
(45) Date of Patent: Aug. 21, 2018

(54) ELECTROCALORIC DEVICE

(71) Applicant: HEWLETT-PACKARD DEVELOPMENT COMPANY, L.P., Houston, TX (US)

(72) Inventors: David Cann, Corvallis, OR (US); Brady Gibbons, Corvallis, OR (US); Troy Ansell, Corvallis, OR (US); James Elmer Abbot, Jr., Corvallis, OR (US)

(73) Assignees: Oregon State University, Corvallis, OR (US); Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/306,848

(22) PCT Filed: Apr. 30, 2014

(86) PCT No.: PCT/US2014/036204
§ 371 (c)(1),
(2) Date: Oct. 26, 2016

(87) PCT Pub. No.: WO2015/167543
PCT Pub. Date: Nov. 5, 2015

(65) Prior Publication Data
US 2017/0054066 A1    Feb. 23, 2017

(51) Int. Cl.
*H01L 23/373* (2006.01)
*H01L 27/16* (2006.01)
(Continued)

(52) U.S. Cl.
CPC .......... *H01L 37/025* (2013.01); *H01L 23/373* (2013.01); *H01L 27/16* (2013.01);
(Continued)

(58) Field of Classification Search
CPC .................................................... H01L 37/025
See application file for complete search history.

(56) References Cited

U.S. PATENT DOCUMENTS

| | | |
|---|---|---|
| 6,595,004 B1 | 7/2003 | Ghoshal |
| 7,441,317 B2 | 10/2008 | Koizumi et al. |

(Continued)

FOREIGN PATENT DOCUMENTS

| | | |
|---|---|---|
| CN | 1715242 | 1/2006 |
| CN | 101234895 | 8/2008 |
| CN | 102336567 | 2/2012 |

OTHER PUBLICATIONS

Vats, et al., "An analysis of lead-free (Bi0.5Na0.5)0.915-(Bi0.5K0.5)0.05Ba0.02Sr0.015TiO3 ceramic for efficient refrigeration and thermal energy harvesting", Journal of Applied Physics 115, 013505 (2014).*

(Continued)

*Primary Examiner* — Tae-Sik Kang
(74) *Attorney, Agent, or Firm* — Klarquist Sparkman, LLP

(57) ABSTRACT

The present disclosure is drawn to electrocaloric devices, methods of making electrocaloric integrated circuits, and methods of thermally cycling integrated circuits. The electrocaloric device can include an electrocaloric material having a solid solution of two or more components of BNT, BKT, BZT, BMgT, or BNiT. The electrocaloric material can have an ergodic transition temperature within a range of 50 C to 300 C. The device can also include electrodes associated with the electrocaloric material, as well as an electrical source to add or reduce electrical field between the electrodes across the electrocaloric material to generate heating or cooling relative to the ergodic transition temperature of the electrocaloric material.

8 Claims, 5 Drawing Sheets

(51) Int. Cl.
*H01L 37/02* (2006.01)
*F25B 21/00* (2006.01)
*H01L 23/367* (2006.01)

(52) U.S. Cl.
CPC ......... *F25B 21/00* (2013.01); *F25B 2321/001* (2013.01); *H01L 23/3677* (2013.01); *H01L 2924/0002* (2013.01); *Y02B 30/66* (2013.01)

(56) References Cited

U.S. PATENT DOCUMENTS

| | | | |
|---|---|---|---|
| 7,652,408 B2 | 1/2010 | Fujii | |
| 2008/0237531 A1 | 10/2008 | Tsukada et al. | |
| 2011/0016885 A1 | 1/2011 | Zhang et al. | |
| 2011/0146308 A1* | 6/2011 | Casasanta | F25B 21/00 62/113 |
| 2011/0203839 A1 | 8/2011 | Iwamoto | |
| 2011/0221830 A1 | 9/2011 | Yonemura et al. | |
| 2012/0055174 A1* | 3/2012 | Kruglick | F25B 21/00 62/56 |
| 2012/0217430 A1 | 8/2012 | Sakai | |
| 2012/0267090 A1 | 10/2012 | Kruglick | |
| 2013/0299607 A1 | 11/2013 | Wilkerson et al. | |
| 2014/0319972 A1* | 10/2014 | Abbott, Jr. | B32B 7/12 310/365 |
| 2015/0075182 A1* | 3/2015 | Cheng | F25B 21/00 62/3.1 |

OTHER PUBLICATIONS

Bai et al.; Abnormal Elactocaloric Effect of Na0.5Bi0.5TIO3—BaTiO3 Lead-Free Ferroelectric Ceramics Above Room Temperature; Elsevier—Material Research Bulletin 46 (2011); Aug. 5, 2011; pp. 1666-1869.

Fonseca, Electrocaloric Cooling Efficiency of Perovskite Ferroelectric Thin Films; Digital Commons@UConn; Aug. 20, 2013; pp. 1-40.

Jiang et al.; Electro caloric Effect Based on the Depolarization Transition in (1-x)Bi0.5Na0.5TiO3—xKNbO3 Lead-Free Ceramics; Science Direct, vol. 40, Issue 2; Mar. 2014; pp. 2627-2634.

Singh et al.; Electro-caloric effect in (Ba1-xCax)(Zr0.05Ti0.95)O3: A lead-free Ferroelectric Material; Applied Physics Letters 103; Nov. 11, 2013.

Wang et al.; Electromechanical and Ferroelectric Properties of Bi1/2Na1/2TiO3—$_n$Bi1/2K1/2TiO3—BaTiO3 Lead-Free Piezoelectric Ceramics; Repository Library; vol. 85, issue 1; Jul. 5, 2004; pp. 91-94.

* cited by examiner

ELECTROCALORIC DEVICE

BACKGROUND

With certain electronic or microchip devices, performance can be limited significantly by their ability to dissipate heat. Thus, by removing heat from a device more quickly, the device itself can perform more efficiently. Larger cooling systems have been used to cool various electronic devices, which are somewhat effective. For example, devices that utilize air flow, liquid cooling, heat dissipation fins, and the like, can be effective at heat dissipation from electronic devices, but these types of systems can sometimes be cumbersome. Regardless of what type of temperature management system is used, efficient cooling of electronic systems can enhance the performance of the overall electronic device.

DETAILED DESCRIPTION

Electrocaloric materials, or materials that exhibit an electrocaloric effect, include materials that have reversible thermal properties, e.g., cooling or heating, under an electric field. Some of these types of materials can be formed as (thick or thin) film stacks or in bulk devices and can thus be useful as a solid state cooling device when in thermal communication with an electronic device, such as an integrated circuit. When referring to "thermal communication" or "thermal contact," this includes both actual physical contact as well as close enough in proximity to impact thermal heat transfer between two specific structures. Furthermore, when referring to an "electronic device," this can include any structure that may heat up during use, and which can be cooled using the technology described herein. Examples of such devices include integrated circuits or microchips, individual electronic features present on microchips, or the like.

Figure 9:
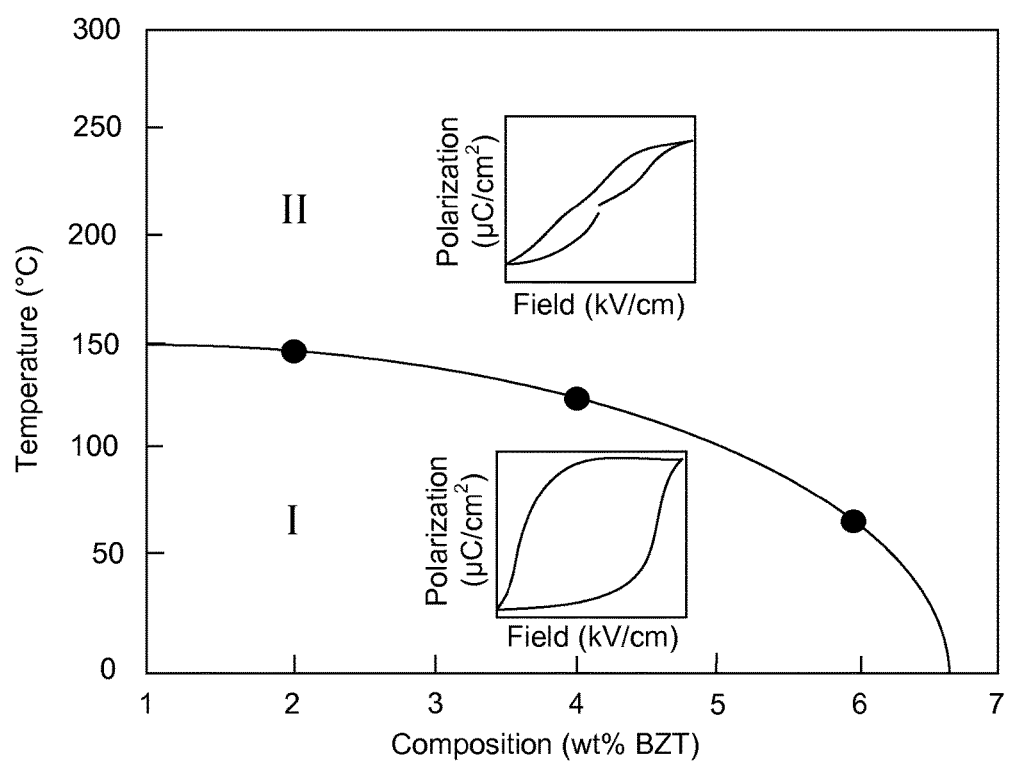
FIG. 9 is a phase equilibrium diagram for electric-field induced phase transition generated from data provided by multiple electrocaloric material solid solutions in accordance with examples of the present disclosure.

In accordance with this, the present disclosure is drawn to solid state temperature control devices and associated methods. In one example, an electrocaloric device, e.g. thin film stack, bulk device, etc., can include an electrocaloric material including a solid solution of two or more components selected from the group consisting of BNT, BKT, BZT, BMgT, and BNiT, wherein the electrocaloric material has an ergodic transition temperature within a range of 50° C. to 300° C. in one example, for from 80° C. to 200° C. in another example. The device can further include electrodes associated with the electrocaloric material, and an electrical source to add or reduce electric field between the electrodes across the electrocaloric material to generate cooling relative to the ergodic transition temperature of the electrocaloric material. The "ergodic transition" temperature referred to previously corresponds to a change in the time varying atomic displacements in a disordered relaxor ferroelectric material. The non-ergodic state represents a state which is characterized by a stable polar phase. The ergodic state represents a state characterized by a non-polar phase. The relative stability of the ergodic (II) state and non-ergodic (I) state is a function of temperature and of composition as shown by example in FIG. 9. In addition, under the application of an electric field of sufficient magnitude, the ergodic state can transition into the non-ergodic state. In one example, the electrocaloric device can be a separate structure that is attached to an integrated circuit, e.g., bolting, strapping, adhering, etc. In another example, the electrocaloric device can be manufactured as part of the integrated circuit, e.g., included as film layers within a thin film stack, thick film multilayer configuration, or a bulk device.

In another example, a method of making an electrocaloric integrated circuit can include thermally associating an electrocaloric device with an electrical feature of an integrated circuit such that the electrocaloric device is positioned in thermal communication with the electrical feature so as to influence the cooling of the electrical feature. The electrocaloric device can include an electrocaloric material and electrodes for providing an electric filed to the electrocaloric material. The electrocaloric material can include a solid solution of two or more components selected from the group consisting of BNT, BKT, BZT, BMgT, and BNiT.

In another example, a method of cooling an integrated circuit can include steps of applying an electric potential across an electrocaloric bismuth-based perovskite material that is thermally coupled with electrical features of an integrated circuit; allowing the electrocaloric bismuth-based perovskite material to increase in temperature in a direction approaching a temperature of the electrical features, e.g., within ±10° C. of the electrical features; and releasing or reducing the electrical potential leading to a decrease in temperature of the electrocaloric material, which in turn draws heat away from the electrical features and into the electrocaloric bismuth-based perovskite material.

With these examples in mind, it is noted that in each of the various embodiments described herein, whether discussing the electrocaloric bismuth-based perovskite material, electrocaloric device, or related methods, there may be some common features that further characterize options in accordance with principles discussed herein. Thus, any discussion of the materials, devices, or methods, either alone or in combination, is also applicable to the other embodiment not specifically mentioned. For example, a discussion of the in electrocaloric properties in the context of a device is also applicable to a method, and vice versa.

Figure 1:
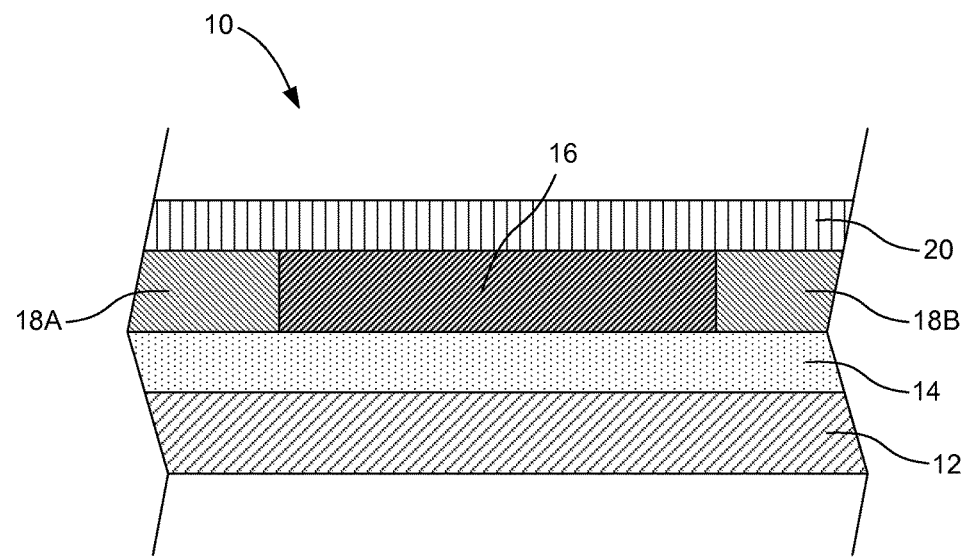
FIG. 1 is a cross-sectional view of a portion of an integrated circuit which includes an electrocaloric material in accordance with examples of the present disclosure.
Figure 2:
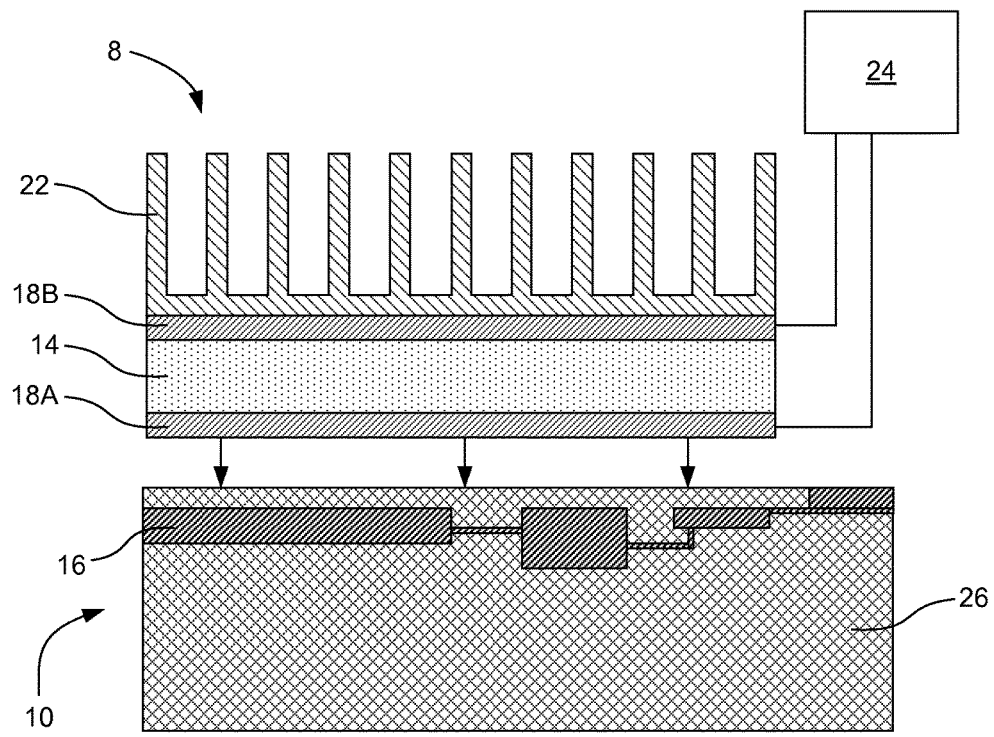
FIG. 2 is cross-sectional view of a portion of an electrocaloric device that is attachable to an integrated circuit prepared in accordance with examples of the present disclosure.
Figure 3A:
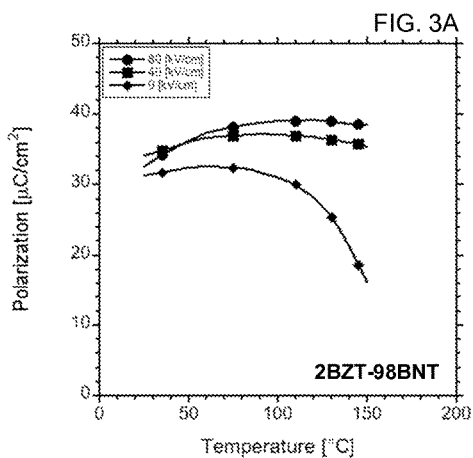
FIG. 3A provides plots of polarization vs. temperature at three different polarizations for a solid solution of 2 mol % BZT and 98 mol % BNT in accordance with examples of the present disclosure.
Figure 4A:
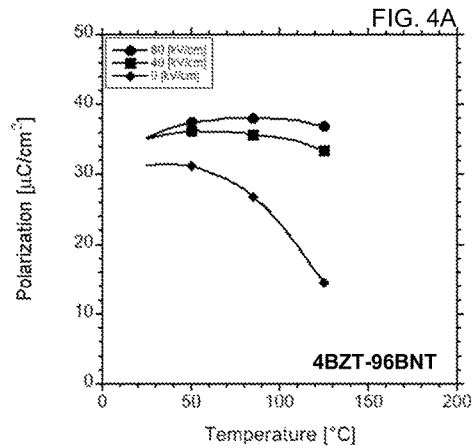
FIG. 4A provides plots of polarization vs. temperature at three different electric field values for a solid solution of 4 mol % BZT and 96 mol % BNT in accordance with examples of the present disclosure.
Figure 3B:
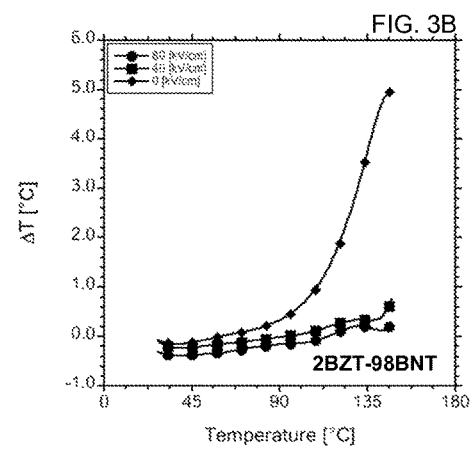
FIG. 3B provides plots of ΔT vs. temperature at three different electric field values for a solid solution of 2 mol % BZT and 98 mol % BNT in accordance with examples of the present disclosure.
Figure 4B:
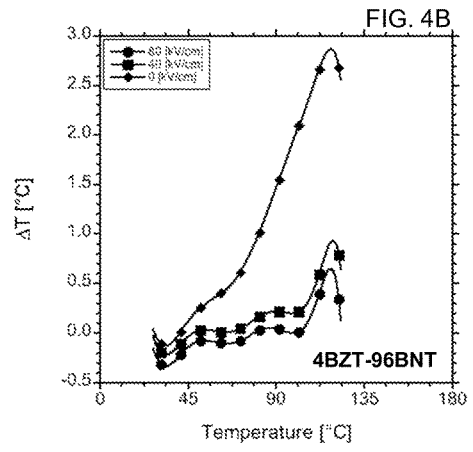
FIG. 4B provides plots of ΔT vs. temperature at three different electric field values for a solid solution of 4 mol % BZT and 96 mol % BNT in accordance with examples of the present disclosure.
Figure 3C:
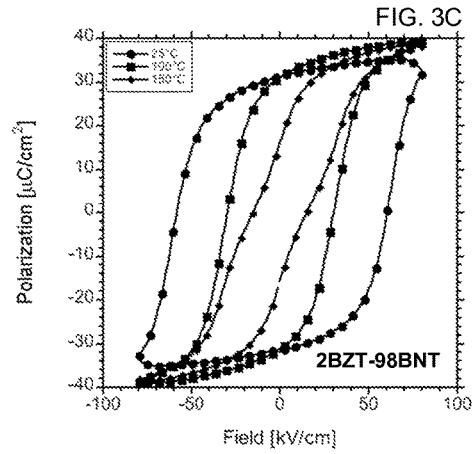
FIG. 3C provides plots of polarization vs. electric field at three different temperatures for a solid solution of 2 mol % BZT and 98 mol % BNT in accordance with examples of the present disclosure.
Figure 4C:
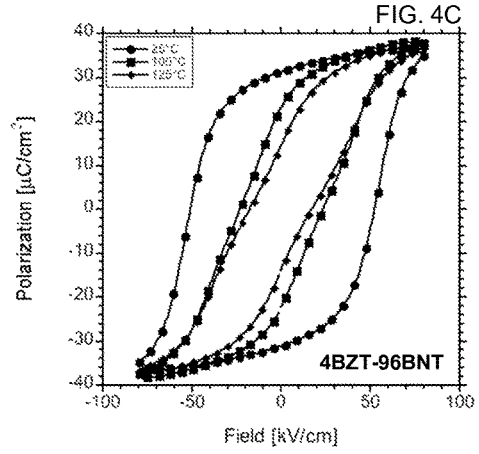
FIG. 4C provides plots of polarization vs. electric field at three different temperatures for a solid solution of 4 mol % BZT and 96 mol % BNT in accordance with examples of the present disclosure.
Figure 5A:
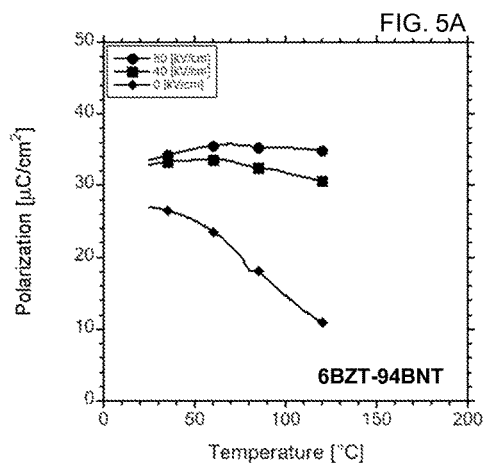
FIG. 5A provides plots of polarization vs. temperature at three different polarizations for a solid solution of 6 mol % BZT and 94 mol % BNT in accordance with examples of the present disclosure.
Figure 6A:
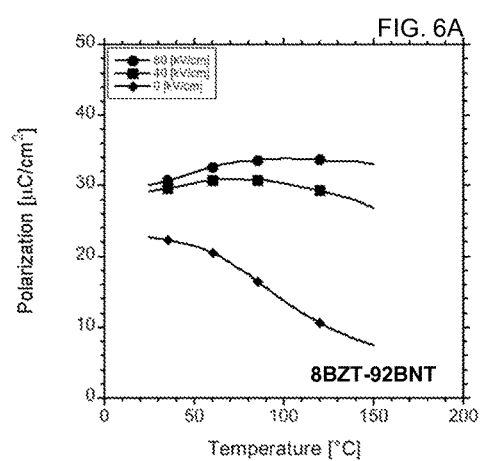
FIG. 6A provides plots of polarization vs. temperature at three different electric field values for a solid solution of 8 mol % BZT and 92 mol % BNT in accordance with examples of the present disclosure.
Figure 5B:
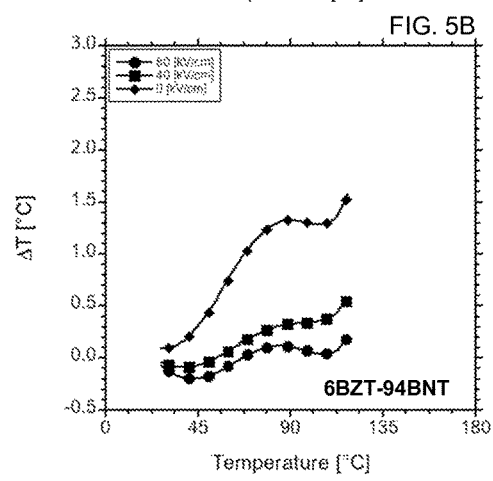
FIG. 5B provides plots of ΔT vs. temperature at three different electric field values for a solid solution of 6 mol % BZT and 94 mol % BNT in accordance with examples of the present disclosure.
Figure 6B:
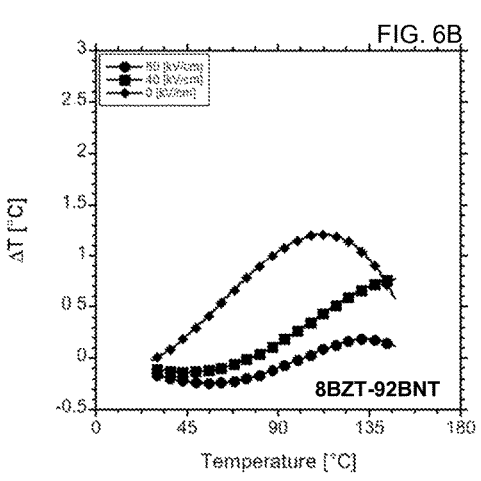
FIG. 6B provides plots of ΔT vs. temperature at three different electric field values for a solid solution of 8 mol % BZT and 92 mol % BNT in accordance with examples of the present disclosure.
Figure 5C:
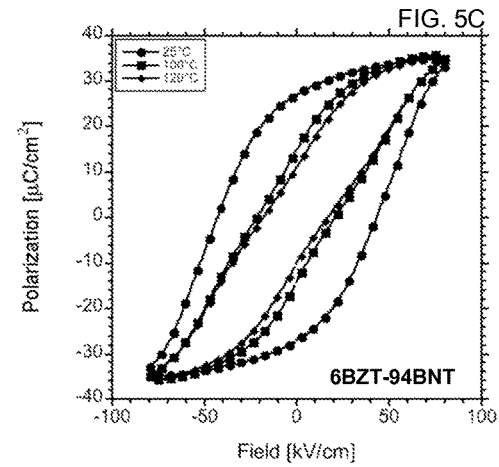
FIG. 5C provides plots of polarization vs. electric field at three different temperatures for a solid solution of 6 mol % BZT and 94 mol % BNT in accordance with examples of the present disclosure.
Figure 6C:
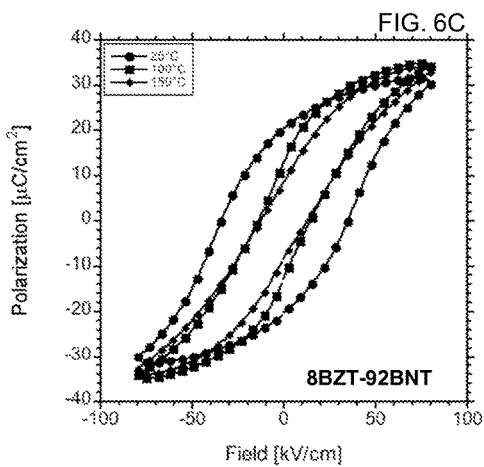
FIG. 6C provides plots of polarization vs. electric field at three different temperatures for a solid solution of 8 mol % BZT and 92 mol % BNT in accordance with examples of the present disclosure.

Regarding structures that can be formed using the electrocaloric materials described herein, FIGS. 1 and 2 provide two examples. FIG. 1, for example, depicts a portion of an example integrated circuit 10 with multiple thin film layers, and depending on the arrangement, can be suitable for cooling a layer that is positioned at an interior position within the thin film stack. Thus, in this example, the electrocaloric device is formed within the thin film stack of the integrated circuit. More specifically, a substrate 12 is shown that can be semi-conductive or conductive, as it is arranged to act as an "electrode" with respect to the adjacent layer of bismuth-based perovskite electrocaloric material 14. Applied to the electrocaloric material layer is an electrical feature 16 that may be in need of cooling during use. The electrical feature can be any feature that may benefit from additional thermal control provided by the electrocaloric material. For example, the electrical feature may be a resistor, a heater that may benefit from a cooling cycle, a memory element, a logic device, or the like, to name just a few. A pair of electrodes 18A, 18B are also shown in this thin film stack which may be used to provide an electric field to the electrical feature, as well as to the electrocaloric material layer. Thus, in this example, the electrocaloric material layer can have its own pair of "electrodes" that are provided by the electrical feature and the substrate, or by the electrodes and the substrate, or both. In this example, the substrate may be conductive or semi-conductive, e.g., doped silicon, to provide a grounded "electrode" for the electrocaloric material layer, and the electrical feature may provide a charged "electrode" for the electrocaloric material layer. Thus, in this example, a synergy may exist between the action of the electrical feature and the induced electrocaloric effect, which can be leveraged together. Alternatively, though not shown in this example, the integrated circuit might be arranged so that the electrical feature has its own electrodes that are separate and distinct from the electrodes used to provide electrical field to the electrocaloric material layer. Any of a number of arrangements can be used, provided the electrocaloric material layer is in thermal communication with the electrical feature that is designed to be thermally influenced or controlled by the electrocaloric material layer.

Referring now to FIG. 2, an electrocaloric device 8 is shown that can be attached to an integrated circuit 10. Attachment can be by any method commonly used to attach cooling systems or devices to integrated circuits, e.g., strapping, adhering, bolting, solder bump, epoxy, thermal adhesive, etc. In this example, the electrocaloric device includes an electrocaloric bismuth-based perovskite material layer 14 and a pair of electrodes 18A, 18B that are used to effectuate the cooling capability of the electrocaloric device. Also shown in this example are heat dissipation fins 22 which can provide additional cooling, if desired. Any of a number of other more traditional cooling systems can be integrated with the electrocaloric material described herein, such as air flow cooling or liquid cooling systems, depending on the structure. An electrical source 24 is also present that can provide the appropriate electric field from the electrodes across the electrocaloric material layer. By cycling the electric field between two (or more) settings, a cooling effect can be generated that assists in more rapidly cooling targeted electronic features.

As mentioned, the electrocaloric device 8 in this example is designed to be attached to the integrated circuit 10. Thus, the integrated circuit includes a substrate 26, which in this example, may be insulating or semi-conducting. Electrical features 16 are embedded in the substrate, and by attaching the electrocaloric device to the integrated circuit, cooling of the electrical features can carried out when desired.

It is noted that these two structural examples are merely exemplary, and others can be likewise be formed as would be appreciated by one skilled in the art after considering the present disclosure. For example, additional intervening layers may be used at various locations for other purposes known in the art, e.g., prevent ion migration, provide improved electrical properties, etc., and such additional layers would not change the basic relationship shown in the FIGS., e.g., thermal communication between an electrocaloric material and an electrical feature or features to be cooled. These materials are usually applied in the form of a film, and can be applied in thermal contact with an electrical feature(s) of an integrated circuit (applied either above, below, or both). In certain examples, the electrical feature to be cooled or heated itself can act as a charged electrode for the electrocaloric bismuth-based perovskite material, and a second structure can act as the other electrode, e.g., a doped silicon substrate, a semi-conductive or metallic layer, or any other structure that may be present. That being stated, there are other arrangements that can be used as would be apparent to one skilled in the art after considering the present disclosure.

Turning now to a more detailed discussion of the bismuth-containing perovskite materials, it has been determined that certain solid solutions of these types of materials can be suitable for solid state thermal management of various electronic devices. Also, by making solid solutions appropriately, cooling profiles that can be used for a given integrated circuit can be tuned. These compositions can be formed by mixing or making solid solutions with various combinations of $Bi_{0.5}Na_{0.5}TiO_3$ (BNT), $Bi_{0.5}K_{0.5}TiO_3$ (BKT), $BiZn_{0.5}Ti_{0.5}O_3$ (BZT), $BiMg_{0.5}Ti_{0.5}O_3$ (BMgT), and $BiNi_{0.5}Ti_{0.5}O_3$ (BNiT). Specifically, these types of materials when in solid solution together (two, three, four, or five) can form a film that exhibits electrocaloric properties. These materials are typically insulating, and thus, can be positioned between a pair of electrodes (or two structures that act as electrodes with respect to the electrocaloric material layer) to provide solid state cooling of electronic devices or components of electronic devices, particularly microchips or integrated circuits of a variety of types.

Generally, bismuth-based perovskite materials in accordance with the disclosed technology can include a variety of combinations of BNT, BKT, BZT, BMgT, and BNiT. As used herein, the names of these components (BNT, BKT, BZT, BMgT, and BNiT) are used to refer to both the pure, stoichiometrically perfect materials, as well as these materials with a small degree of non-stoichiometry or doping included. However, since the materials used are typically not only electrocaloric, but also act as a passivation or insulating layer, the materials typically are not modified to the extent that they start to become semiconducting. The typical material will be prepared that is both electrocaloric as well as insulating to provide a capacitive space between a grounded electrode (e.g., silicon substrate or metallic layer) and a charged electrode (e.g., resistor element).

As mentioned, in some examples, an electrocaloric bismuth-based perovskite material can include two of the perovskite compounds selected from BNT, BKT, BZT, BMgT, and BNiT. In one such example, the electrocaloric material can be BNT-BMgT. Other examples include BKT-BMgT, BKT-BNT, BKT-BZT, BNiT-BNT, or BNiT-BKT. In some examples, the electrocaloric material can include one of the following general chemical formulas:

xBNiT-yBKT;

xBNiT-yBNT;

xBMgT-yBKT;

xBMgT-yBNT; or xBZT-yBNT;

where x+y=1 and x≤0.25 (or otherwise limited based on solubility or stability).

Many compositions with stable perovskite structures can be found according to the above chemical formulas when 0<x<0.25, where x corresponds to the mole fraction of BZT, BMgT, or BNiT. Thus, many compositions with stable perovskite structures can be found according to these chemical formulas when 0<x<0.25. In one specific example, the electrocaloric material can be 80BNT-20BMgT, which has the chemical formula (0.8)BNT-(0.2)BMgT. In another specific example, the electrocaloric material can be 10BZT-90BKT, which has the chemical formula (0.1)BZT-(0.9)BKT. In another specific example, the electrocaloric material can be 2.5BZT-97.5BNT, which has the chemical formula (0.025)BZT-(0.975)BNT. As can be seen from these formulas, BNiT, BZT, or BMgT are usually present at 25 mol %, though this is not required. These are merely examples to illustrate the nomenclature for these types of materials.

In still further examples, an electrocaloric bismuth-based perovskite material can include three of the perovskite compounds selected from BNT, BKT, BZT, BMgT, and BNiT. Several possible ternary compositions are possible, and a few specific formulations can include BZT-BKT-BNT, BNiT-BKT-BNT, and BMgT-BKT-BNT. In further detail, by one example only, an electrocaloric material can include the general chemical formula xBZT-yBKT-zBNT, wherein x+y+z=1 and x, y, z≠0. The same formulation can be used for other compounds as well. Many compositions according to the above general chemical formula can have stable perovskite structures when 0<x<0.25, 0.01<y<0.99, and 0.01<z<0.99. In other examples, the electrocaloric material can have the above general chemical formula wherein 0<x<0.10, 0.01<y<0.99, and 0.01<z<0.99. In yet other examples, the electrocaloric material can have the above general chemical formula wherein 0<x<0.19, y=0.28-0.50 and z=0.40-0.65. Compositions in this range can have especially high maximum electromechanical strain coefficients ($d_{33}$), as discussed further below. In still more examples, the electrocaloric material can have any composition according to the above general chemical formula except for compositions where 0.01<x<0.25, 0.01<y<0.99 and 0.01<z<0.99.

Other ternary compositions can be obtained according to the general chemical formula xBNiT-yBKT-zBNT, wherein x+y+z=1, and x, y, z≠0. Many compositions according to this chemical formula can have stable perovskite structures when 0.01<x<0.25. Additional ternary compositions can be obtained by the general chemical formula xBMgT-yBKT-zBNT, wherein x+y+z=1, and x, y, z≠0. Many compositions according to this chemical formula can have stable perovskite structures when 0.01<x<0.25.

Beyond ternary compositions, electrocaloric materials can also include combinations of four of the perovskite compounds selected from BNT, BKT, BZT, BMgT, and BNiT. All five of these compounds can also be combined. Furthermore, the electrocaloric materials are not limited to containing only these perovskite compounds. Rather, the electrocaloric materials can contain other components as well.

In further detail, binary (i.e. having two members) or ternary (i.e. having three members) compositions (or even solid solutions of four or five members) can be produced via solid-state synthesis methods, using the appropriate amounts of ZnO, NiO, MgO, (or $MgCO_3$) $Bi_2O_3$, $TiO_2$, $NaCO_3$ and $KCO_3$ starting powders of usually at least 99% purity. Appropriate amounts of those powders can be combined to yield the final binary composition xBZT-yBNT, xBMgT-yBNT, xBNiT-yBNT, xBZT-yBKT, xBMgT-yBKT, or xBNiT-yBKT, wherein x+y=1. Alternatively, appropriate amounts of the starting powders can combined to yield the final ternary composition with the general chemical formula xBZT-yBKT-zBNT, xBMgT-yBKT-zBNT, or xBNiT-yBKT-zBNT, wherein x+y+z=1. These are merely a few examples, and others can be prepared as well The electrocaloric ceramic materials can be made by any suitable solid-state synthesis method, using starting powders such as $Bi_2O_3$, $NaCO_3$, $KCO_3$, ZnO, and $TiO_2$. The relative amounts of BNT, BKT, BZT, BMgT, and BNiT may be adjusted so that the product will exhibit an ergodic transition that is appropriate for a specific application. By adjusting relative amounts of the ingredients above, an ergodic transition can be generated that is useful for cooling a specific resistor element within a desired temperature profile using electrical potential, or for providing additional cooling assistance for jetting inks that may not normally be particularly usable with a specific resistor material. As mentioned, in certain examples, a suitable ergodic transition temperature for an electrocaloric material as described herein can range from 50° C. to 300° C., or from 80° C. to 200° C., for example.

In accordance with conventional solid state synthesis methods for making ceramic materials, the powders can be milled, shaped, and calcined to produce the desired ceramic product. Milling can be either wet or dry type milling, as is known in the art. High energy vibratory milling may be used, for instance, to mix starting powders and for post-calcination grinding. The powders can be mixed with a suitable liquid, e.g., ethanol or water or a combination of liquids, and wet milled with a suitable high density milling media, e.g., yttria stabilized zirconia (YSZ) beads. The milled powders can be calcined, then mixed with a binder, formed into the desired shape, e.g., pellets, and sintered to produce a ceramic product with high sintered density.

When the intended use of the ceramic material utilizes a thin film product, the production method can be modified to include chemical solution deposition using chemical precursors such bismuth nitrate, titanium isopropoxide, etc., or sputtering using solid state sintered or hot-pressed ceramic targets. Any suitable sputtering or chemical deposition method can be used for this purpose. The resulting thin film ceramic can have a thickness in the range of about 50 nm to about 10 μm, in some cases.

In further detail, these bismuth-containing perovskite materials possess a number of possible structural distortions that are very close in energy. One consequence of this is that the structures are highly compliant and are thus highly responsive to external stimuli (and hence produce large field-induced strains). Second, some of these compositions can undergo an electric field-induced phase transformation (e.g. from a cubic phase to a tetragonal phase). A large change in volume (and polarization) may accompany this phase transition. Furthermore, when a first electric field is applied to these materials, they can exhibit cooling properties, and when a second electric field is applied, they can be allowed to heat back up in preparation for another cooling cycle. For each specific material solid solution, electric fields that generate cooling can be determined experimentally by one skilled in the art and as described by the present disclosure.

Within this family of bismuth perovskite materials, compositions that exhibit a solid-state phase transformation based on a relaxor-to-ferroelectric transition can be desirable for use. Thus, with these materials, the electrocaloric effect can be determined and defined as a change in temperature due to the application of an electric field under adiabatic conditions. Specifically, the change in temperature ($\Delta T$) for a material of density $\rho$ with heat capacity C is given by:

$$\Delta T = -T \int_{E_1}^{E_2} \frac{1}{C_E(E, T)} \left(\frac{\partial P}{\partial T}\right)_E dE \qquad \text{Formula I}$$

In Formula I, T is temperature, E is electric field, C is heat capacity, d indicates derivative, and P is polarization. The large change in polarization such as that seen in FIGS. 3C, 4C, 5C, 6C, 7, and 8 drives a large change in entropy which underpins the adiabatic change in temperature, T.

The bismuth-based perovskite materials of the present technology can be evaluated to determine the magnitude of the electrocaloric effect (in units of $\Delta T$ (K)). A series of polarization data for various bismuth-based perovskite material solid solutions can be obtained, for example, with a maximum electric field fixed at 80 kV/cm. The polarization response can be measured at temperatures ranging from room temperature up to 150° C. This data can then be analyzed according to Formula I assuming that the heat capacity is held constant as a function of electric field and temperature. The magnitude of the heat capacity can fixed at the value for bismuth.

Figure 7:
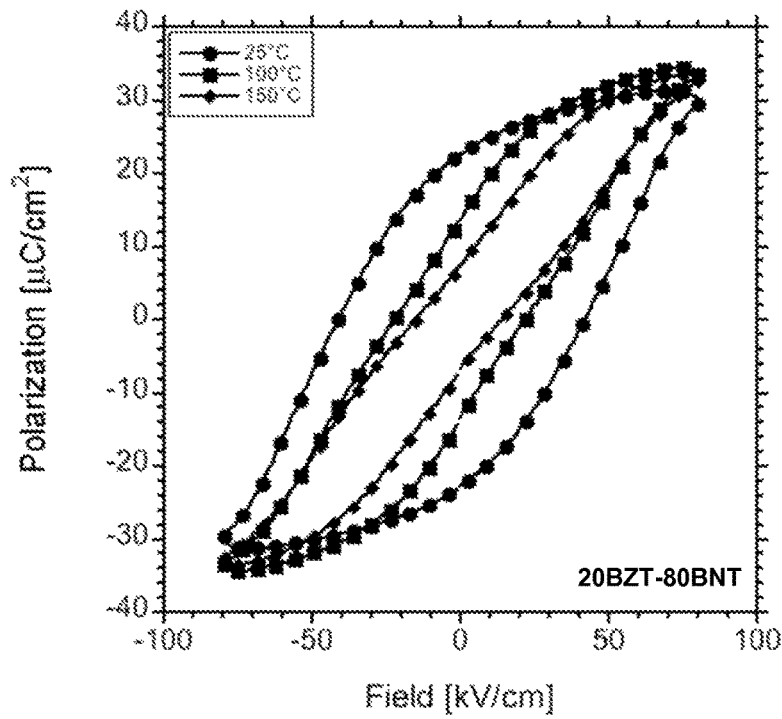
FIG. 7 provides plots of polarization vs. electric field at three different temperatures for a solid solution of 20 mol % BZT and 80 mol % BNT in accordance with examples of the present disclosure.
Figure 8:
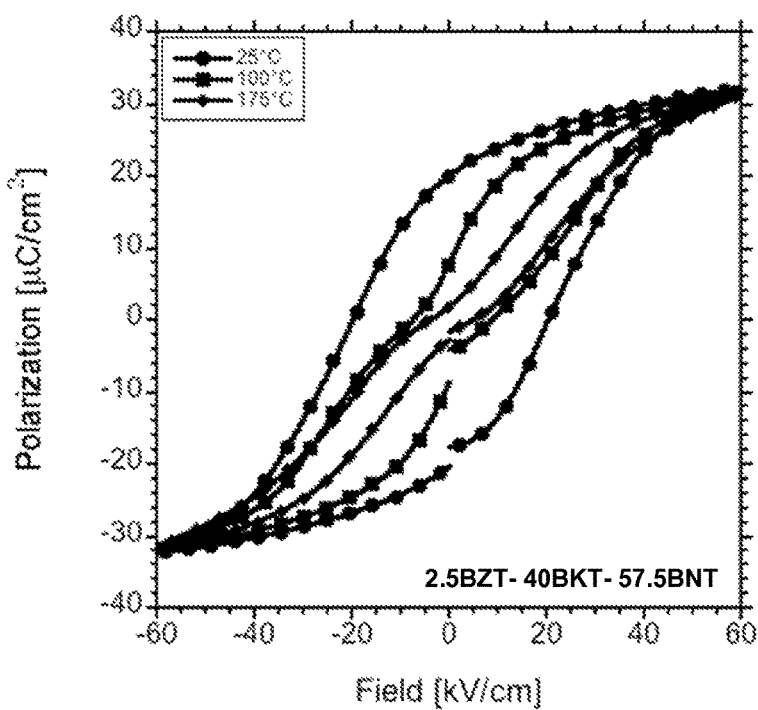
FIG. 8 provides plots of polarization vs. electric field at three different temperatures for a solid solution of 2.5 mol % BZT, 40 mol % BKT, and 57.5 mol % BNT in accordance with examples of the present disclosure.

Example of data can be found in FIGS. 3A to 8 where different solid solutions of various materials were evaluated. FIGS. 3A, 4A, 5A, and 6A are plots of measured polarization vs. temperature. FIGS. 3B, 4B, 5B, and 6B are plots of calculated DT achievable at various applied electric fields. These data are calculated using the measured data in FIGS. 3A, 4A, 5A, and 6A and Formula I. FIGS. 3C, 4C, 5C, 6C, 7, and 8 provide data for polarization versus applied electric field at different temperatures. FIG. 3C provides the data for the material 2 mol % $Bi(Zn_{0.5}Ti_{0.5})O_3$ and 98 mol % $(Bi_{0.5}Na_{0.5})TiO_3$. FIG. 4C provides the data for the material 4 mol % $Bi(Zn_{0.5}Ti_{0.5})O_3$ and 96 mol % $(Bi_{0.5}Na_{0.5})TiO_3$. FIG. 5C provides the data for the material 6 mol % $Bi(Zn_{0.5}Ti_{0.5})O_3$ and 94 mol % $(Bi_{0.5}Na_{0.5})TiO_3$. FIG. 6C provides the data for the material 8 mol % $Bi(Zn_{0.5}Ti_{0.5})O_3$ and 92 mol % $(Bi_{0.5}Na_{0.5})TiO_3$. FIG. 7 provides the data for the material 20 mol % $Bi(Zn_{0.5}Ti_{0.5})O_3$ and 80 mol % $(Bi_{0.5}Na_{0.5})TiO_3$. FIG. 8 provides the data for the material 2.5 mol % $Bi(Zn_{0.5}Ti_{0.5})O_3$; and 40 mol % $(Bi_{0.5}K_{0.5}TiO_3)$; 57.5 mol % $(Bi_{0.5}Na_{0.5})TiO_3$.

The overall adiabatic change in temperature is obtained from integrating Formula 1 with a polynomial fit to the polarization data. Three specific material solid solutions, i.e. 2 mol % BZT, 4 mol % BZT, and 6 mol % BZT, for example, can be used to generate a phase equilibrium diagram for the electric-field induced phase transition in the $Bi(Zn_{0.5}Ti_{0.5})O_3$—$(Bi_{0.5}Na_{0.5})TiO_3$ system. The diagram is shown specifically in FIG. 9. Furthermore, for a range of compositions with xBZT-(1−x)BNT as the general formula, where x=0.02, x=0.04, x=0.06, x=0.08, and x=0.2, an analysis shows evidence of adiabatic temperature changes as high as 5° C. Furthermore, the data show that the maximum temperature change occurs at temperature ranges from about 50° and 100° C.

The existing data demonstrates that a large, reversible change in polarization can be realized due to a phase transition at low electric fields (E~10 to 20 kV/cm, for example). Other material systems associated with electrocaloric cooling typically utilize much larger fields. Because of these lower electric fields that can be used to generate a phase transition, there are some advantages over other materials that utilize larger electric fields for the phase transition. First, the lower field levels will help minimize the overall power requirements of the device. Second, fields of this magnitude are easily accessible in bulk ceramic devices as opposed to more complex thin film systems. As the total heat flux can depend upon the mass/volume of the electrocaloric material, bulk devices may be more suitable for cooling applications. Another advantage is that this phase change phenomena can be engineered to occur at temperatures 50° C. to 100° C. above the ambient temperature, which is an area where many different types of integrated circuits could benefit from this type of solid state cooling device. Thus, electrocaloric coefficients near the typical operating temperatures of electronic devices make these materials and associated cooling arrangements highly practical. Furthermore, the transition temperature can be easily "tuned" through compositional modifications, as illustrated by FIGS. 3A to 6C.

It is noted that, as used in this specification and the appended claims, the singular forms "a," "an," and "the" include plural referents unless the context clearly dictates otherwise.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 mol % to about 5 mol %" should be interpreted to include not only the explicitly recited values of about 1 mol % to about 5 mol %, but also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

EXAMPLE

Various BZT-BNT materials are prepared with relative proportions (mole percent) 2BZT-98BNT, 4BZT-96BNT, 6BZT-94BNT, 8BZT-92BNT, and 20BZT-80BNT. Additionally, a solid solution of three components is also prepared in relative proportions (mole percent) 2.5BZT-40BKT-57.5BNT. In preparing these compositions, six hours of high energy vibratory milling is used for mixing starting powders and for post-calcination grinding. Ethanol mixtures containing 15 vol % powder is milled with high density YSZ beads approximately ⅜ inch in diameter. After removal of YSZ, calcination is performed on the milled powder in covered crucibles at 900° C. for 6 hours. The calcined powders are mixed with a 3 wt % solution of Polyvinyl Butyral (PVB) binder, and the powders are uniaxially cold pressed into 12.7 mm pellets at a pressure of 150 MPa. Following a 400° C. binder burnout step, the pellets are sintered in covered crucibles at 1100° C. for 2 hours. Prior to electrical measurements, the ceramics discs are polished to thickness of 1 mm with smooth and parallel surfaces. Electrodes are applied and silver paste (Heraeus C1000) is fired on both sides in air at 500-800° C. for 30 minutes. The final dimensions of the specimen may have about a 10 mm diameter and a 1 mm thickness. The materials prepared in accordance with this example were used to generate the data shown in FIGS. 3A to 8.

While the disclosure has been described with reference to certain examples, those skilled in the art will appreciate that various modifications, changes, omissions, and substitutions can be made without departing from the spirit of the disclosure. It is intended, therefore, that the present disclosure be limited only by the scope of the following claims.

What is claimed is:

1. An electrocaloric device, comprising:
   an electrocaloric material comprising a solid solution of two or more components selected from the group consisting of $Bi_{0.5}Na_{0.5}TiO_3$ (BNT), $Bi_{0.5}K_{0.5}TiO_3$ (BKT), $BiZn_{0.5}Ti_{0.5}O_3$ (BZT), $BiMg_{0.5}Ti_{0.5}O_3$ (BMgT), and $BiNi_{0.5}Ti_{0.5}O_3$ (BNiT), wherein the solid solution of the electrocaloric material includes one of the following formulas: xBNiT-yBKT, xBNiT-yBNT, xBMgT-yBKT, xBMgT-yBNT, and xBZT-yBNT, where x+y=1 and x≤0.25;
   electrodes associated with the electrocaloric material; and
   an electrical source to add or reduce electrical field between the electrodes across the electrocaloric material to generate cooling relative to the ergodic transition temperature of the electrocaloric material.

2. The electrocaloric device of claim 1, wherein the electrocaloric device is part of a multilayer film stack or bulk device within an integrated circuit.

3. The electrocaloric device of claim 2, wherein the integrated circuit includes an electrical feature, and the electrocaloric material is in thermal communication with the electrical feature for thermally cooling the electrical feature.

4. The electrocaloric device of claim 3, wherein the electrical feature also acts as one of the electrodes for the electrocaloric material.

5. The electrocaloric device of claim 1, further comprising an attachment mechanism or adhesive for attaching the electrocaloric device to an integrated circuit.

6. The electrocaloric device of claim 1, wherein the electrocaloric material has an ergodic transition temperature within the range of 80° C. to 200° C.

7. The electrocaloric device of claim 1, wherein the electrocaloric material has an ergodic transition temperature within a range of 50° C. to 300° C.

8. An electrocaloric device, comprising:
   an electrocaloric material comprising a solid solution of two or more components selected from the group consisting of $Bi_{0.5}Na_{0.5}TiO_3$ (BNT), $Bi_{0.5}K_{0.5}TiO_3$ (BKT), $BiZn_{0.5}Ti_{0.5}O_3$ (BZT), $BiMg_{0.5}Ti_{0.5}O_3$ (BMgT), and $BiNi_{0.5}Ti_{0.5}O_3$ (BNiT), wherein the electrocaloric material comprises a solid solution of three components selected from the group consisting of BNT, BKT, BZT, BMgT, and BNiT based on one of the following formulas: xBNiT-yBKT-zBNT, and xBMgT-yBKT-zBNT, where x+y+z=1, 0<x<0.25, 0.01<y<0.99, and 0.01<z<0.99;
   electrodes associated with the electrocaloric material; and
   an electrical source to add or reduce electrical field between the electrodes across the electrocaloric material to generate cooling relative to the ergodic transition temperature of the electrocaloric material.

* * * * *